(12) United States Patent
Hachigo

(10) Patent No.: US 8,183,668 B2
(45) Date of Patent: May 22, 2012

(54) GALLIUM NITRIDE SUBSTRATE

(75) Inventor: Akihiro Hachigo, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 182 days.

(21) Appl. No.: 12/788,455

(22) Filed: May 27, 2010

(65) Prior Publication Data

US 2011/0073871 A1    Mar. 31, 2011

(30) Foreign Application Priority Data

Sep. 30, 2009    (JP) .............................. P2009-227768

(51) Int. Cl.
*H01L 29/20*    (2006.01)
(52) U.S. Cl. .... 257/615; 257/76; 257/609; 257/E29.004
(58) Field of Classification Search .................... 257/76, 257/609, 615, E29.004, E29.089
See application file for complete search history.

(56) References Cited

U.S. PATENT DOCUMENTS

| | | | |
|---|---|---|---|
| 6,379,985 B1* | 4/2002 | Cervantes et al. | 438/33 |
| 2006/0027896 A1* | 2/2006 | Fujiwara et al. | 257/615 |
| 2006/0097353 A1* | 5/2006 | Motoki et al. | 257/609 |
| 2008/0210959 A1* | 9/2008 | Nagai et al. | 257/94 |
| 2009/0052489 A1* | 2/2009 | Nomura | 372/49.01 |
| 2010/0008393 A1* | 1/2010 | Enya et al. | 372/46.01 |
| 2010/0104495 A1* | 4/2010 | Kawabata et al. | 423/409 |
| 2010/0187565 A1* | 7/2010 | Kamei et al. | 257/103 |
| 2010/0210089 A1* | 8/2010 | Kasai et al. | 438/458 |
| 2010/0230690 A1* | 9/2010 | Kyono et al. | 257/94 |
| 2011/0089536 A1* | 4/2011 | Brandes et al. | 257/615 |
| 2011/0193122 A1* | 8/2011 | Yuh | 257/98 |
| 2011/0201184 A1* | 8/2011 | Motoki et al. | 438/492 |

FOREIGN PATENT DOCUMENTS

| | | |
|---|---|---|
| EP | 1 624 095 | 2/2006 |
| JP | 2006-044982 | 2/2006 |

OTHER PUBLICATIONS

Hogan et al. "Angles between planes in the hexagonal and tetragonal crystal systems" Micron, 1970, vol. 2, pp. 59-61.*
Vurgaftman et al. "Band parameters for nitrogen-containing semiconductors" Journal of Applied Physics, vol. 94, No. 6, Sep. 15, 2003, pp. 3675-3696.*
Yohei Enya et al., "531 nm Green Lasing of InGaN Based Laser Diodes on Semi-Polar{2021} Free-Standing GaN Substrates", Applied Physics Express, The Japan Society of Applied Physics, Jul. 2009, vol. 2, No. 8, 082101.
Yusuke Yoshizumi et al., "Continuous-Wave Operation of 520mm Green InGaN-Based Laser Diodes on Semi-Polar {2021} GaN Substrates", Applied Physics Express, The Japan Society of Applied Physics, Aug. 2009, vol. 2, No. 9, 092101.
"Aug. 20, 2009 issue of Nikkan Kogyo Shimbun", Nikkan Kogyo Shimbun Ltd. Aug. 20, 2009, p. 9, including English Abstract.

(Continued)

*Primary Examiner* — Matthew Landau
*Assistant Examiner* — Joseph C Nicely
(74) *Attorney, Agent, or Firm* — Drinker Biddle & Reath LLP

(57) ABSTRACT

A gallium nitride substrate comprising a primary surface, the primary surface being tilted at an angle in a range of 20 to 160 degrees with respect to a C-plane of the substrate, and the substrate having a fracture toughness of more than or equal to 1.36 $MN/m^{3/2}$.

9 Claims, 3 Drawing Sheets

OTHER PUBLICATIONS

"The Green Semiconductor Laser Finally Oscillates. Sumitomo Electric Industries, Ltd. Succeeded in the Pulsed Oscillation", Nezu, Nikkei Electronics, Nikkei BP, Aug. 24, 2009, p. 15, including partial English translation.

I. Yonenaga et al., "High-temperature hardness of bulk single-crystal gallium nitride-in comparison with other wide-gap materials", Journal of Physics: Condensed Matter, Dec. 11, 2000, vol. 12, No. 49, pp. 10319-10323.

M. D. Drory et al., "Hardness and fracture toughness of bulk single crystal gallium nitride", Applied Physics Letters, American Institute of Physics, Dec. 23, 1996, vol. 69, No. 26, pp. 4044-4046.

* cited by examiner

*Fig.2*

|  | $I_A$ | | $I_B$ | |
|---|---|---|---|---|
|  | FRACTURE TOUGHNESS | CRACK JUDGMENT | FRACTURE TOUGHNESS | CRACK JUDGMENT |
| 0° | 1. 18 | × | 1. 25 | ○ |
| 18° | 1. 21 | × | 1. 30 | ○ |
| 23° | 1. 29 | × | 1. 36 | ○ |
| 75° | 1. 34 | × | 1. 43 | ○ |

Fig.3

| TILT ANGLE (OFF ANGLE) | TILT IN [1-100] DIRECTION | TILT IN [11-20] DIRECTION |
|---|---|---|
| 23° | $W_C$: NINE SUBSTRATES UNBROKEN | $W_A$: SEVEN SUBSTRATES UNBROKEN |
| 75° | $W_D$: NINE SUBSTRATES UNBROKEN | $W_B$: EIGHT SUBSTRATES UNBROKEN |

GALLIUM NITRIDE SUBSTRATE

BACKGROUND OF THE INVENTION

1. Field of the Invention

The present invention relates to a gallium nitride (GaN) substrate.

2. Related Background Art

A substrate composed of single crystal nitride semiconductor is disclosed (cf. Japanese Unexamined Patent Application Publication No. 2006-044982). This substrate includes $Al_xGa_{1-x}N$ ($0 \leq X \leq 1$) in composition and has a fracture toughness value of more than or equal to $(1.2-0.7x)$ MPa·m$^{1/2}$. A primary surface of the substrate has an area of more than or equal to 20 cm$^2$.

SUMMARY OF THE INVENTION

GaN-based compound semiconductors such as GaN and InGaN have a wide band gap energy. Therefore, the GaN-based compound semiconductors are expected to be applied to light emitting devices emitting short wavelength light such as blue and green light. In general, a GaN-based compound semiconductor is grown on a heterogeneous substrate made of a material (e.g., Si, SiC, or sapphire) with a coefficient of thermal expansion close to that of the GaN-based compound semiconductor. The GaN-based compound semiconductor is grown by a method such as Molecular Beam Epitaxy (MBE) or Metal Organic Chemical Vapor Deposition (MOCVD).

However, the GaN-based compound semiconductor grown on the heterogeneous substrate causes problems such as stress in the substrate because of lattice mismatch, and a difference between the coefficients of thermal expansion. This stress brings about warpage of a device, detachment of thin film, and increase in dislocation density and, thereby, adversely affects on device characteristics. In contrast, when the GaN-based compound semiconductor is grown on a GaN substrate, the foregoing problems are not caused because the coefficient of thermal expansion and the lattice constant of the GaN-based compound semiconductor are nearly equal to those of the GaN substrate. For this reason, good device characteristics are achieved.

In production of the GaN substrate, however, GaN is grown on a heterogeneous substrate like sapphire. Hence, the GaN substrate is easier to crack than a silicon substrate because GaN has many crystal defects. On the other hand, a manufacturing cost per GaN substrate is high because of low growth rate of GaN crystal, raw material cost, and so forth. Thus, the production of GaN substrates are required to reduce the percent defective due to crack.

For some required emission wavelengths of the light emitting devices, a GaN-based compound semiconductor containing indium (e.g., InGaN, InAlGaN, or the like) is grown on a GaN substrate. Since a diameter of indium atoms is larger than that of gallium atoms, an increase in composition ratio of indium leads to an increase in internal strain in an indium-containing layer because of lattice mismatch. As a consequence, a large piezoelectric field is produced in the indium-containing layer to lower a recombination probability, resulting in low luminous efficiency.

In order to solve the problem as described above, there is a technology under research to grow the indium-containing GaN-based compound semiconductor on a primary surface tilted at a large angle with respect to the C-plane of the GaN crystal. The tilt of the primary surface at a large angle with respect to the C-plane can reduce the piezoelectric field.

However, the following fact has been found by Inventors' study. When the GaN substrate has the primary surface tilted at a large angle with respect to the C-plane of the GaN crystal, the GaN substrate is easy to crack even if it has fracture toughness enough for the GaN substrate having a primary surface that extends to the C-plane.

It is an object of the present invention to provide a GaN substrate hard to crack and capable of enhancing a production yield.

A GaN substrate according to the present invention has a primary surface. The primary surface is tilted at an angle in a range of 20 to 160 degrees with respect to a C-plane of the GaN substrate. The GaN substrate has a fracture toughness of more than or equal to 1.36 MN/m$^{3/2}$.

The present invention provides the GaN substrate hard to crack and less likely to break. When the primary surface is tilted at the angle in the range of 20 to 160 degrees with respect to the C-plane of the substrate, the substrate can be hard to crack and reduce cracks if the fracture toughness thereof is more than or equal to 1.36 MN/m$^{3/2}$.

The primary surface of the GaN substrate may be tilted in a [1-100] direction of the substrate. It was confirmed by Inventors' experiment that the substrate was harder to crack and reduced more cracks when the primary surface was tilted in the [1-100] direction than when it was tilted in the [11-20] direction.

The primary surface may have a longitudinal direction being a [11-20] direction of the substrate and a transverse direction perpendicular to the [11-20] direction. It was confirmed by Inventors' experiment that the substrate was harder to crack and reduced more cracks when the longitudinal direction of the primary surface was the [11-20] direction than when the longitudinal direction of the primary surface was the direction perpendicular to the [11-20] direction.

The angle between the primary surface and the C-plane may be in the range of 71 to 79 degrees. A short-wavelength light emitting device (particularly, laser diode) can be suitably produced by using the GaN substrate having such a primary surface. In this case, the GaN substrate may have a cleaved surface that extends in a direction perpendicular to the [11-20] direction. The cleaved surface herein refers, for example, to a cut surface for making up an end face of a cavity for a laser beam. Cleavage directions of a GaN substrate of the C-plane are usually the [1-100] direction and the [11-20] direction. The inventors, however, found that the cleavage characteristics of the GaN substrate having the primary surface tilted with respect to the C-plane varied depending on the tilt angle. When the angle between the primary surface of the GaN substrate and the C-plane of the substrate is in the range of 71 to 79 degrees, the GaN substrate is more likely to cleave along the direction perpendicular to the [11-20] direction than along the [11-20] direction. Therefore, in the case of producing a semiconductor device required to have a mirror face, such as a laser diode, the GaN substrate preferably has a cleaved surface that extends in the direction perpendicular to the [11-20] direction.

The above object and other objects, features, and advantages of the present invention are more readily apparent from the following detailed description of its preferred embodiments set forth with reference to the accompanying drawings.

As described above, an aspect of the present invention provides the GaN substrate hard to crack and less likely to break.

BRIEF DESCRIPTION OF THE DRAWINGS

FIG. 2 is a table showing values of fracture toughness and crack occurrences of substrates in Example 1.

FIG. 3 is a table showing crack occurrences after processing of substrates in Example 2.

DETAILED DESCRIPTION OF THE PREFERRED EMBODIMENTS

Figure 1:
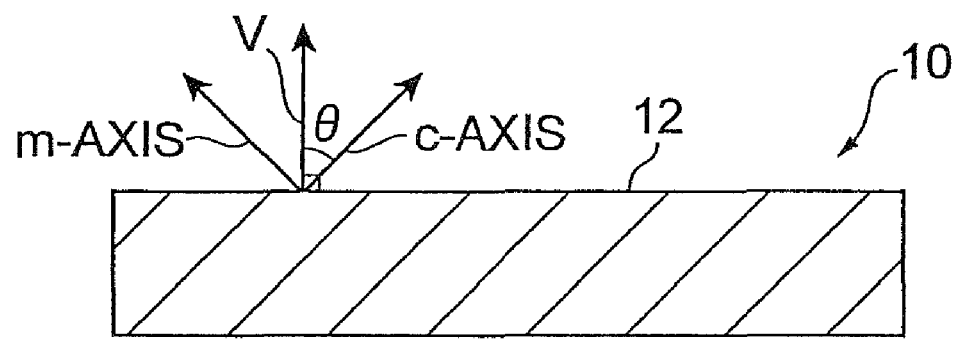
FIG. 1 is a sectional view schematically showing a GaN substrate according to an embodiment.

Embodiments of the GaN substrate in accordance with the present invention will be explained in detail with reference to FIGS. 1 to 3 in the following. The same or equivalent parts will be referred to with the same signs in the explanation of the drawings.

FIG. 1 is a sectional view schematically showing a GaN substrate according to an embodiment. For example, the GaN substrate 10 shown in FIG. 1 is cut out of a GaN monocrystal ingot having a diameter of two inches (one inch is equivalent to 2.54 centimeters) and a thickness of one centimeter. This GaN substrate 10 may be composed of a hexagonal or cubic GaN monocrystal. For example, the hexagonal GaN monocrystal has the wurtzite structure. The hexagonal GaN monocrystal has a (0001) face called the C-plane, a (1-100) face called the M-plane, a (11-20) face called the A-plane, a (01-12) face called the R-plane, and a (10-11) plane called the S-plane.

The GaN substrate 10 has a mirror-polished primary surface 12. A device is formed on the primary surface 12. The device is, for example, a light emitting device such as an LED or a laser diode. The primary surface 12 is tilted at a predetermined angle with respect to the C-plane of the GaN monocrystal of the GaN substrate 10. In the present embodiment, the tilt angle of the primary surface 12 with respect to the C-plane of the GaN monocrystal (i.e., angle θ between a vector V normal to the primary surface 12 and the c-axis) is in the range of 20 to 160 degrees where influence of the piezoelectric field can be effectively suppressed, and is, for example, a value of 23 or 75 degrees. Particularly, in the GaN substrate 10 which is used to produce a short-wavelength light emitting device (especially, a laser diode), the tilt angle of the primary surface 12 with respect to the C-plane of the GaN monocrystal is preferably 75 degrees in order to suppress the piezoelectric field. In this case, the tilt angle can be in the range of 71 to 79 degrees to obtain similar effects with 75 degrees.

The fracture toughness of the GaN monocrystal of the GaN substrate 10 is more than or equal to 1.36 MN/m$^{3/2}$. In the tilt angle of the primary surface 12 with respect to the C-plane of the GaN monocrystal which is in the range of 20 to 160 degrees as in the present embodiment, the below-described experiment results reveal that the GaN substrate is hard to crack and less likely to break if the fracture toughness of the GaN monocrystal is more than or equal to 1.36 MN/m$^{3/2}$. Therefore, the resultant GaN substrate 10 can be resistant to breakage.

The fracture toughness of the GaN monocrystal can be controlled by a dopant concentration. The dopant concentration of the GaN substrate 10 that realizes the foregoing fracture toughness is less than or equal to $3\times10^{20}$ cm$^{-3}$, for example, in the GaN substrate 10 that is doped with oxygen and has the n conductivity type. When the dopant concentration of the GaN substrate 10 is less than or equal to $3\times10^{20}$ cm$^{-3}$, device characteristics can be kept without deterioration of crystallinity of the GaN monocrystal. A lower limit of the dopant concentration of the GaN substrate 10 is, for example, $1\times10^{16}$ cm$^{-3}$ because it becomes difficult to control the dopant concentration of the GaN substrate 10 if the dopant concentration is less than $1\times10^{16}$ cm$^{-3}$. The fracture toughness of the GaN substrate 10 can be known by measuring a length of a crack that is formed by forcing a diamond indenter (Vickers indenter) into a surface (e.g., the primary surface 12) of the GaN substrate 10. The fracture toughness KIc is determined by Equation (1) below.

$$KIc=0.016\times(E/H)^{0.5}\times(P/c^{1.5}) \quad (1)$$

In Equation (1), KIc indicates the fracture toughness (in unit of MN/m$^{3/2}$), "E" indicates the Young's modulus, "H" indicates the Vickers hardness, "P" indicates a load, and "c" indicates the crack length.

The primary surface 12 is preferably tilted in the [1-100] direction (i.e., the m-axis direction) with respect to the C-plane of the GaN monocrystal. It is because it is confirmed by the below-described experiment results that the GaN substrate becomes harder to crack and less likely to break when the primary surface 12 is tilted in the [1-100] direction than when it is tilted in the [11-20] direction.

The tilt of the primary surface 12 in the [1-100] direction means that the normal vector to the primary surface 12 is included in a plane defined by the c-axis vector of the GaN monocrystal and the [1-100] direction vector (which is the m-axis vector), and that there is an angle of more than 0 degree between the normal vector and the c-axis vector. When the primary surface 12 is tilted in the [1-100] direction with respect to the C-plane of the GaN monocrystal, the GaN substrate 10 may have a cleaved surface extending in a direction perpendicular to the [11-20] direction. Cleavage directions of a substrate having a primary surface of the C-plane are usually the [1-100] direction and the [11-20] direction. However, the below-described experiment results reveal that, in the case where the GaN substrate has the primary surface tilted with respect to the C-plane, the cleavage characteristics of the GaN substrate varies depending on its tilt angle. When an angle between the primary surface 12 and the C-plane of the GaN monocrystal is in the range of 71 to 79 degrees, the GaN substrate 10 is more likely to cleave in the direction perpendicular to the [11-20] direction than in the [11-20] direction. In producing a semiconductor device required to have a mirror surface, e.g., a laser diode, the GaN substrate 10 is preferably cleaved in the direction perpendicular to the [11-20] direction.

An example of the shape of the GaN substrate 10 is described as follows. For example, the primary surface 12 has a longitudinal direction that is the [11-20] direction and a transverse direction perpendicular to the [11-20] direction. An example of dimensions of this GaN substrate 10 is as follows: the length of 15 mm in the longitudinal direction; the width of 10 mm in the transverse direction; and the thickness of 500 μm. As in this example, the length of the GaN substrate 10 in the [11-20] direction may be longer than the width of the GaN substrate 10 in the direction perpendicular to the [11-20] direction. The below-described experiment results show that the GaN substrate 10 becomes harder to crack and less likely to break in the case where the longitudinal direction of the GaN substrate 10 is the [11-20] direction than in the case where the longitudinal direction of the GaN substrate 10 is perpendicular to the [11-20] direction.

EXAMPLE 1

GaN ingots doped with oxygen were prepared. The GaN ingots had the diameter of two inches and the thickness of one centimeter. The GaN ingots had a primary surface that extends to the (0001) face (or C-plane) in the hexagonal structure. The GaN ingots had the electric resistivity of less than or equal to 1 Ω·cm. A carrier concentration of the GaN ingots was less than or equal to $1\times10^{17}$ cm$^{-3}$. In this Example, two GaN ingots $I_A$ and $I_B$ were prepared. The dopant concentration of GaN ingots $I_A$ and $I_B$ were different from each other, so that the fracture toughness values of GaN ingots $I_A$ and $I_B$ were different from each other.

These GaN ingots $I_A$ and $I_B$ were sliced to obtain eleven substrates having the thickness of 500 μm. In the slice step, the GaN ingots $I_A$ and $I_B$ were sliced at tilt angles of 0, 18, 23, and 75 degrees with respect to the [1-100] direction (or the m-axis direction) to produce four types of substrates which have respective tilt angles. The fracture toughness values of the substrates, one for each type, were measured.

In this Example, the number of the substrates without any crack having the length of at least 10 μm was counted in each type of substrates and each type was judged good when such substrates were half or more (50% or more). FIG. 2 is a table showing the measurement results of fracture toughness and the results of crack judgment of each type of the substrates having the tilt angles of 0, 18, 23, and 75 degrees. As shown in FIG. 2, it was found that occurrence of crack was effectively suppressed if the tilt angle of the primary surface with respect to the C-plane of the GaN monocrystal was more than or equal to 23 degrees and if the fracture toughness value was more than or equal to 1.36.

EXAMPLE 2

The GaN ingot $I_B$ used in Example 1 was prepared. Two types of substrates $W_A$ and $W_B$ with the cut surface having their respective tilt angles of 23 and 75 degrees were prepared, ten for each type, by slicing the GaN ingot $I_B$ from the [11-20] direction (or the a-axis direction) and tilting the cut surface in the [11-20] direction with respect to the C-plane. Furthermore, two types of substrates $W_C$ and $W_D$ with the cut surface having their respective tilt angles of 23 and 75 degrees were prepared, ten for each type, by slicing the GaN ingot $I_B$ from the [1-100] direction and tilting the cut surface in the [1-100] direction with respect to the C-plane. These substrates $W_A$-$W_D$ had the thickness of 500 μm after sliced, and they were then ground and polished to the thickness of 400 μm.

FIG. 3 is a graph showing the numbers of substrates remaining unbroken after the processing, out of ten of each type of the substrates $W_A$-$W_D$. As shown in FIG. 3, when the substrates $W_A$ and $W_B$ that have the primary surface tilted in the [11-20] direction (a-axis direction) were compared to the substrates $W_C$ and $W_D$ that have the primary surface tilted in the [1-100] direction (m-axis direction), the substrates $W_C$ and $W_D$ were less likely to crack and break than the substrates $W_A$ and $W_B$, irrespective of the tilt angle.

EXAMPLE 3

A load was applied to the substrate $W_B$ with the primary surface tilted 75 degrees in the [1-100] direction, which was produced in Example 2 above. This test was carried out with a dynamic micro hardness tester (DUH-201S available from Shimadzu Corporation). The load was applied in such a manner that projected directions on the surface of the substrate $W_B$ of ridge lines of a triangular pyramid Berkovich indenter (in other words, extending directions of depressed lines of indentations in the surface when viewed from the direction normal to the surface of the substrate $W_B$) coincided with the [11-20] direction (a-axis direction) and a direction perpendicular to the [11-20] direction. On this occasion, the load was 100 gF (1 gF is equivalent to 9.80665 g·m/s²) and the loading time was two seconds.

In this Example, the application of the load caused the substrate $W_B$ to crack, the crack extended in the direction perpendicular to the [11-20] direction independent of the orientation of the Berkovich indenter. Therefore, the substrate $W_B$ was more likely to break in the direction perpendicular to the [11-20] direction than in the [11-20]direction (a-axis direction).

EXAMPLE 4

Four types of substrates $W_E$, $W_F$, $W_G$, and $W_H$ were prepared. The substrates $W_E$ had the primary surface tilted 23 degrees in the [1-100] direction with respect to the C-plane, the length of 10 mm in the [11-20] direction, and the length of 5 mm in the direction perpendicular to the [11-20] direction. The substrates $W_F$ had the primary surface tilted 23 degrees in the [1-100] direction with respect to the C-plane, the length of 5 mm in the [11-20] direction, and the length of 10 mm in the direction perpendicular to the [11-20] direction. The substrates $W_G$ had the primary surface tilted 75 degrees in the [1-100] direction with respect to the C-plane, the length of 10 mm in the [11-20] direction, and the length of 5 mm in the direction perpendicular to the [11-20] direction. The substrates $W_H$ had the primary surface tilted 75 degrees in the [1-100] direction with respect to the C-plane, the length of 5 mm in the [11-20] direction, and the length of 10 mm in the direction perpendicular to the [11-20] direction.

The number of scratches having the depth of at least 10 μm was counted in each type of the substrates $W_E$ to $W_H$. An average of the scratch numbers was calculated for each type of the four substrates $W_E$ to $W_H$. Here, $A_E$ indicates the average of the scratch numbers of the substrates $W_E$ with the longitudinal direction along the [11-20] direction. $A_F$ indicates the average of the scratch numbers of the substrates $W_F$ with the longitudinal direction along the direction perpendicular to the [11-20] direction. $A_G$ indicates the average of the scratch numbers of the substrates $W_G$ with the longitudinal direction along the [11-20]direction. $A_H$ indicates the average of the scratch numbers of the substrates $W_H$ with the longitudinal direction along the direction perpendicular to the [11-20] direction. Then a ratio $(A_E/A_F)$ was 0.78, and a ratio $(A_G/A_H)$ was 0.65. This made it clear that the substrate became hard to crack when the longitudinal direction of the substrate was the [11-20] direction.

The foregoing embodiment and examples illustrated the cases where the GaN substrate had the primary surface tilted in the [1-100] direction and the cases where the GaN substrate had the primary surface tilted in the [11-20] direction. It should be, however, noted that the present invention allows the primary surface of the GaN substrate to be tilted in another direction.

The principle of the present invention was illustrated and explained in the preferred embodiments, but it can be recognized by those skilled in the art that the present invention can be modified in arrangement and detail without departing from the principle. It should be understood that the present invention is by no means limited to the specific configurations disclosed in the embodiments. Therefore, the Applicant claims all modifications and changes falling within the scope of claims and coming from the scope of spirit thereof.

What is claimed is:
1. A gallium nitride substrate comprising a primary surface, the primary surface being tilted at an angle in a range of 20 to 160 degrees with respect to a C-plane of the substrate, and the substrate having a fracture toughness of more than or equal to 1.36 MN/m$^{3/2}$, further comprising a cleaved surface that extends in a direction perpendicular to a [11-20] direction.

2. The gallium nitride substrate according to claim 1, wherein the primary surface is tilted in a [1-100] direction of the substrate.

3. The gallium nitride substrate according to claim 2, wherein the primary surface has a longitudinal direction being a [11-20] direction of the substrate and a transverse direction perpendicular to the [11-20] direction.

4. The gallium nitride substrate according to claim 2, wherein the angle between the primary surface and the C-plane is in a range of 71 to 79 degrees.

5. A gallium nitride substrate comprising a primary surface, the primary surface being tilted at an angle in a range of 20 to 160 degrees with respect to a C-plane of the substrate, the substrate having a fracture toughness of more than or equal to 1.36 MN/m$^{3/2}$, the primary surface having a longitudinal direction and a transverse direction, the longitudinal direction being a [11-20] direction of the substrate, and the transverse direction being perpendicular to the [11-20] direction further comprising a cleaved surface that extends in a direction perpendicular to a [11-20] direction.

6. The gallium nitride substrate according to claim 5, wherein the angle between the primary surface and the C-plane is in a range of 71 to 79 degrees.

7. A gallium nitride substrate comprising a primary surface, the primary surface being tilted at an angle in a range of 71 to 79 degrees with respect to a C-plane of the substrate, the substrate having a fracture toughness of more than or equal to 1.36 MN/m$^{3/2}$, further comprising a cleaved surface that extends in a direction perpendicular to a [11-20] direction.

8. A gallium nitride substrate comprising a primary surface and a cleaved surface that extends in a direction perpendicular to the [11-20] direction, the primary surface being tilted at an angle in a range of 20 to 160 degrees with respect to a C-plane of the substrate, the substrate having a fracture toughness of more than or equal to 1.36 MN/m$^{3/2}$.

9. A gallium nitride substrate comprising a primary surface, the primary surface being tilted at an angle in a range of 71 to 79 degrees with respect to a C-plane of the substrate, and the substrate having a fracture toughness of more than or equal to 1.36 MN/m$^{3/2}$, the primary surface having a longitudinal direction and a transverse direction, the longitudinal direction being a [11-20] direction of the substrate, and the transverse direction being perpendicular to the [11-20]direction, further comprising a cleaved surface that extends in a direction perpendicular to a [11-20] direction.

* * * * *